United States Patent [19]
Moon

[11] Patent Number: 5,650,250
[45] Date of Patent: Jul. 22, 1997

[54] LIGHT EXPOSURE MASK FOR SEMICONDUCTOR DEVICES

[75] Inventor: Seung Chan Moon, Kyoungki-do, Rep. of Korea

[73] Assignee: Hyundai Electronics Industries Co., Ltd., Kyoungki-do, Rep. of Korea

[21] Appl. No.: 569,508

[22] Filed: Dec. 8, 1995

[30] Foreign Application Priority Data

Dec. 29, 1994 [KR] Rep. of Korea ............ 94-39061

[51] Int. Cl.$^6$ .................................................. G03F 9/00
[52] U.S. Cl. .................................................. 430/5; 430/312
[58] Field of Search .......................... 430/5, 311, 312, 430/313, 315

[56] References Cited

U.S. PATENT DOCUMENTS

| | | | |
|---|---|---|---|
| 5,364,718 | 11/1994 | Oae et al. | 430/5 |
| 5,439,765 | 8/1995 | Nozue | 430/5 |

*Primary Examiner*—S. Rosasco
*Attorney, Agent, or Firm*—Nath & Associates; Gary M. Nath; Richard E. Campbell

[57] ABSTRACT

A light exposure mask for a semiconductor device having different line/space pattern widths at different mask portions in such a manner that its repeated patterns disposed at the central mask portion corresponding to the memory region of the semiconductor device have a minimum line/space width whereas those disposed at the peripheral mask portion have a line/space width larger than the minimum width, such that its non-uniform patterns disposed at the peripheral mask portion have a space width larger than the minimum width, and such that its independent pattern has a line width larger than the minimum width. With such line/space pattern widths, the light exposure mask is capable of preventing a short circuit caused by the residue of a photoresist film material after a light exposure according to the modified illumination method or caused by an excessive light exposure, forming a precise micro pattern, increasing the process redundancy, and thereby achieving an improvement in process yield and operation reliance.

2 Claims, 3 Drawing Sheets

LIGHT EXPOSURE MASK FOR SEMICONDUCTOR DEVICES

BACKGROUND OF THE INVENTION

1. Field of the Invention

The present invention relates to a light exposure mask for semiconductor devices, and more particularly to a light exposure mask capable of exhibiting a constant light contrast throughout all mask portions when a light exposure is carried out in accordance with a modified illumination method, thereby achieving an improvement in process yield and operation reliance.

2. Description of the Prior Art

The recent trend to fabricate highly integrated semiconductor devices has been greatly affected by the development of techniques of forming patterns having a micro dimension. Photoresist film patterns formed by a photolithography process are widely used as masks for carrying out an etch process or ion implantation process in the fabrication of semiconductor devices.

Generally, micro patterns for semiconductor devices are formed by uniformly coating a photoresist solution, which consists of a resin solved in a solvent of a certain amount along with a photoresist agent, over a semiconductor substrate to form a photoresist film, and then selectively irradiating light onto the photoresist film by use of a photoresist film pattern mask, thereby exposing, to the light, the portion of the photoresist film except for its portion occupied by the mask to form a photoresist film pattern. Thereafter, the light-exposed portion of the photoresist film is removed using an alkali development solution, thereby forming a photoresist film pattern. Using the photoresist film pattern, a conduction layer disposed beneath the photoresist film pattern is then etched, thereby forming a micro pattern.

With regard to such a micro pattern, the wiring width and space between neighboring wirings, namely, the line/space dimension can be adjusted by the photoresist pattern. However, this general technique is difficult to form a micro pattern having a critical dimension smaller than a certain dimension because of various limitations on the accuracy of the light exposure device and wavelength of light.

Conventional steppers, for example, using G-line, i-line and CrF excimer lasers respectively having wavelengths of 436, 365 and 248 nm as their light sources have resolutions only capable of forming patterns having line/space dimensions of about 0.7, 0.5 and 0.3 μm, respectively.

In order to form micro patterns having a critical dimension smaller than the limit of the resolution of the above-mentioned steppers, various methods have been proposed which use a light exposure device with a light source of a short wavelength or with an increased accuracy, or use a phase shift mask as the light exposure mask.

A modified illumination method has also been proposed to achieve an improvement in light contrast by utilizing an interference between two light beams, namely, the 0th light beam and the +1'st or −1'st light beam both passing through a light transmission lens. In accordance with this method, the central portion of light incident on the light exposure mask is shielded in an annular or quadrapole shape.

Such a method is effective in providing an improvement in light contrast to line/space-repeated patterns.

FIGS. 1A to 1C are plan views of a light exposure mask employed to fabricate a semiconductor device in accordance with the modified illumination method, respectively taken at different positions.

FIG. 1A is a plan view of a portion of the light exposure mask corresponding to the memory region of the semiconductor device. Referring to FIG. 1A, repeated chromium patterns 2 having a certain uniform line/space dimension are formed on a transparent substrate 1.

On the other hand, FIGS. 1B and 1C are plan views respectively showing portions of the light exposure mask corresponding to peripheral circuit regions of the semiconductor device. These mask portions are provided with non-uniform patterns 3 or an independent pattern 4 including contact holes or inner wirings.

FIG. 2 is a graph illustrating light intensities respectively exhibited at different portions of the light exposure mask.

Referring to FIG. 2, it can be found that the repeated patterns disposed at the central portion 2A of the mask exhibit a higher light intensity than those disposed at the peripheral portion 2B of the mask. Thus, the repeated patterns 2 disposed at the peripheral mask portion 2B exhibit a reduced light contrast as compared to those disposed at the central mask portion 2A.

On the other hand, the non-uniform patterns 3 exhibit a reduced light contrast as compared to the repeated patterns 2. The independent pattern 4 has a lower light contrast than the non-uniform patterns 3. Thus, the light contrast varies depending on portions of the semiconductor device where the above-mentioned conventional light exposure mask (see FIG. 1) is used.

Where such a light exposure mask exhibiting different light contrasts for the same line width is used, setting of optimum energy with reference to the repeated patterns 2 disposed at the central mask pattern 2A results in the residue of the photoresist film material at spaces defined by the patterns of the peripheral mask portion 2B and non-uniform patterns 3. On the other hand, when the optimum condition is set with respect to the non-uniform patterns 3 exhibiting the smaller light contrast, there is a problem that the line width of the repeated patterns 2 is undesirably reduced. Since the photoresist film has a variation in thickness by the topology of the wafer, a bulk effect is generated which causes the processing steps to be instable.

SUMMARY OF THE INVENTION

Therefore, an object of the invention is to eliminate the above-mentioned problems and to provide a light exposure mask for semiconductor devices capable of preventing a short circuit caused by the residue of a photoresist film material after a light exposure according to the modified illumination method or a disconnection caused by an excessive light exposure, forming a precise micro pattern, increasing the process redundancy, thereby achieving an improvement in process yield and operation reliance.

In accordance with the present invention, this object is accomplished by providing a light exposure mask for a semiconductor device, including a transparent substrate, repeated patterns, non-uniform patterns and an independent pattern, each of the repeated patterns being formed on a portion of the transparent substrate corresponding to a memory region of the semiconductor device, and each of the non-uniform and independent patterns being formed on a portion of the transparent substrate corresponding to a peripheral circuit region of the semiconductor device, wherein: the repeated patterns have a minimum line/space pattern width at a central portion of the mask and a line/space pattern width larger than the minimum line/space width at a peripheral portion of the mask; the non-uniform patterns have a space width larger than the minimum space width; and the independent pattern has a line width larger than the minimum line width.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1A:
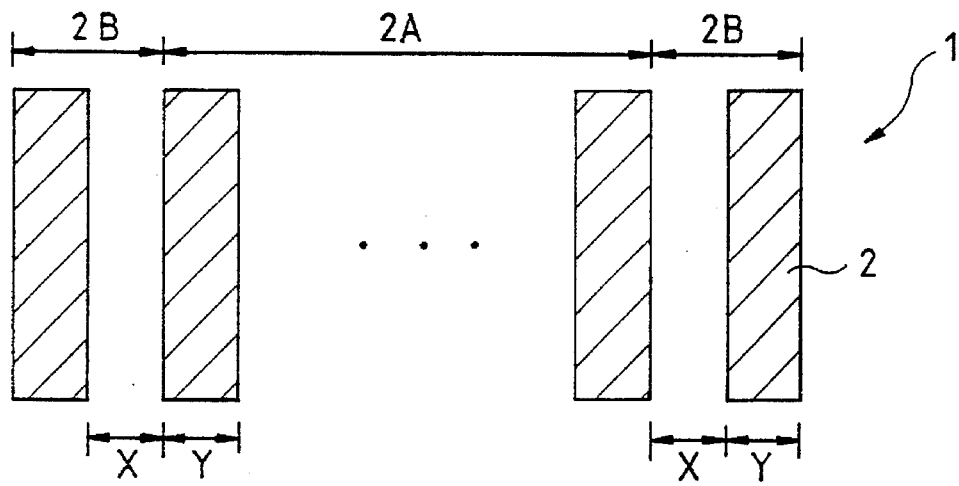
FIGS. 1A to 1C are plan views of a light exposure mask employed to fabricate a semiconductor device in accordance with the modified illumination method, respectively taken at different positions.
Figure 1B:
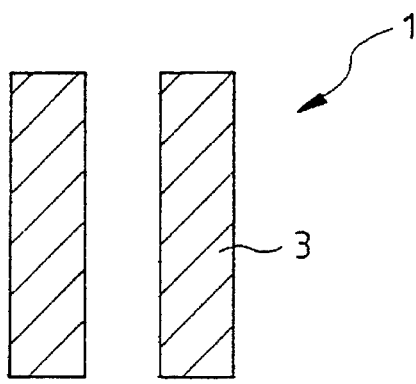
Figure 1C:
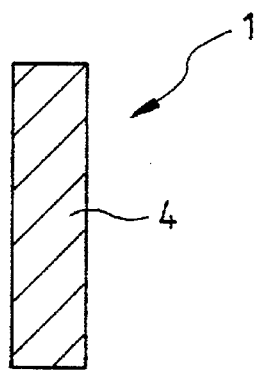
Figure 2:
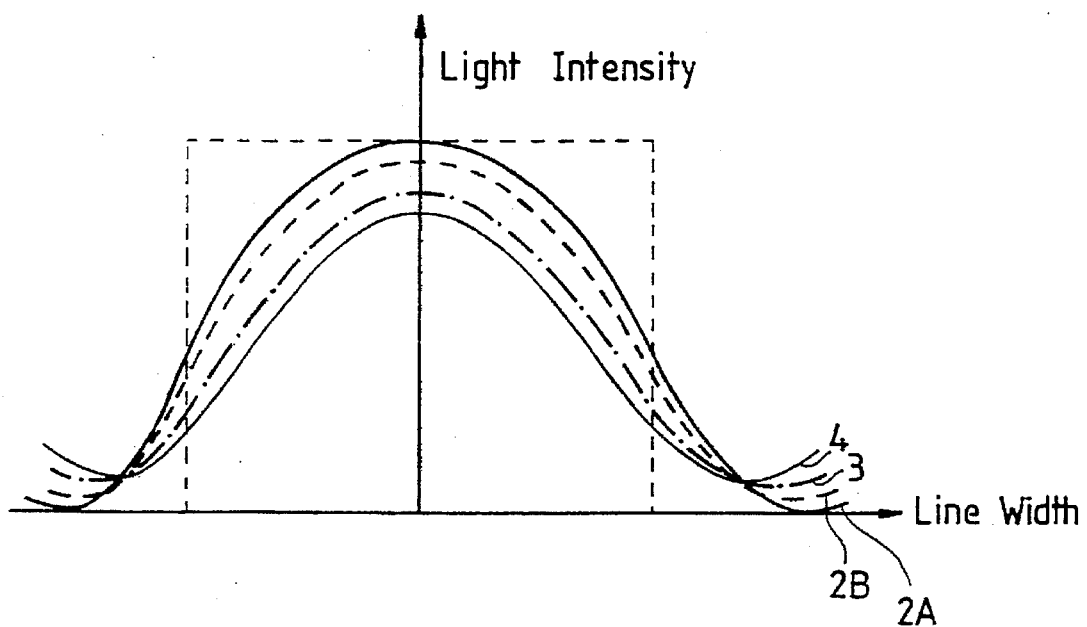
FIG. 2 is a graph illustrating light intensities respectively exhibited at different portions of the light exposure mask shown in FIGS. 1A to 1C.
Figure 3A:
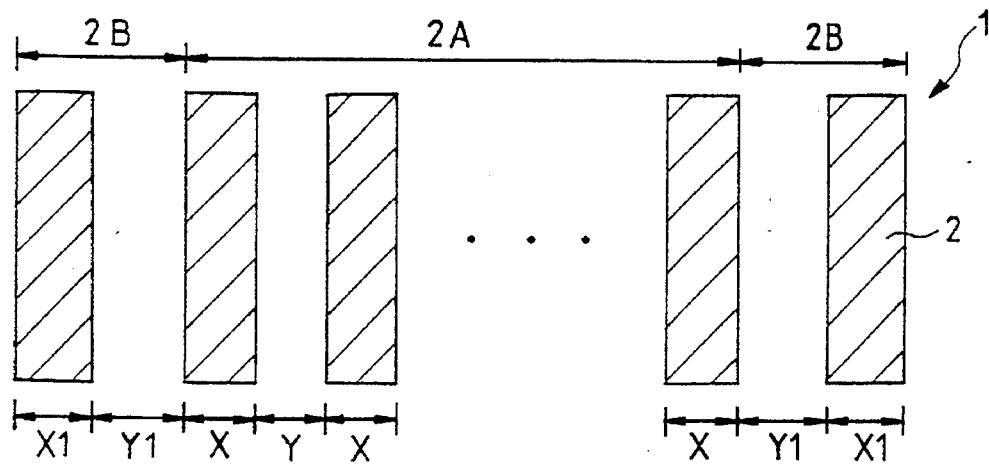
FIGS. 3A to 3C are plan views of a light exposure mask having a structure according to the present invention, respectively taken at different positions.
Figure 3B:
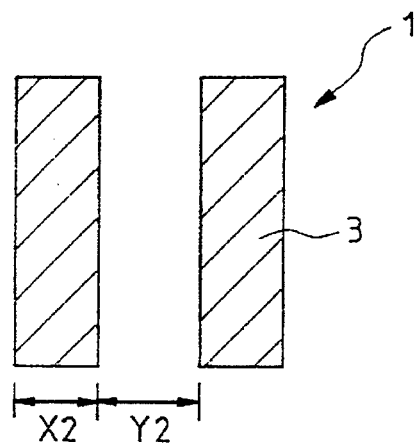
Figure 3C:
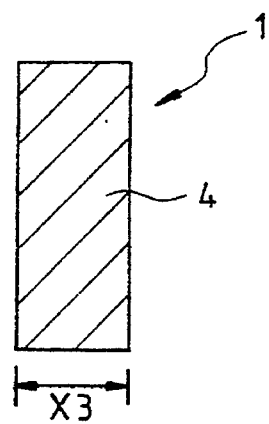

FIGS. 3A to 3C are plan views of a light exposure mask having a structure according to the present invention, respectively taken at different positions. The light exposure mask is adapted to fabricate a semiconductor device in accordance with the modified illumination method. In FIGS. 3A to 3C, elements respectively corresponding to those in FIGS. 1A to 1C are denoted by the same reference numerals.

FIG. 3A is a plan view of a portion of the light exposure mask corresponding to the memory region of the semiconductor device. Referring to FIG. 3A, on a transparent substrate 1 repeated chromium patterns 2 having a uniform line/space are formed.

The repeated patterns disposed at the central portion 2A of the mask have minimum line and space widths of X and Y, respectively. The repeated patterns disposed at the peripheral portion 2B of the mask have line and space widths of X1 and Y1 respectively larger than the minimum line and space widths X and Y.

Figure 4:
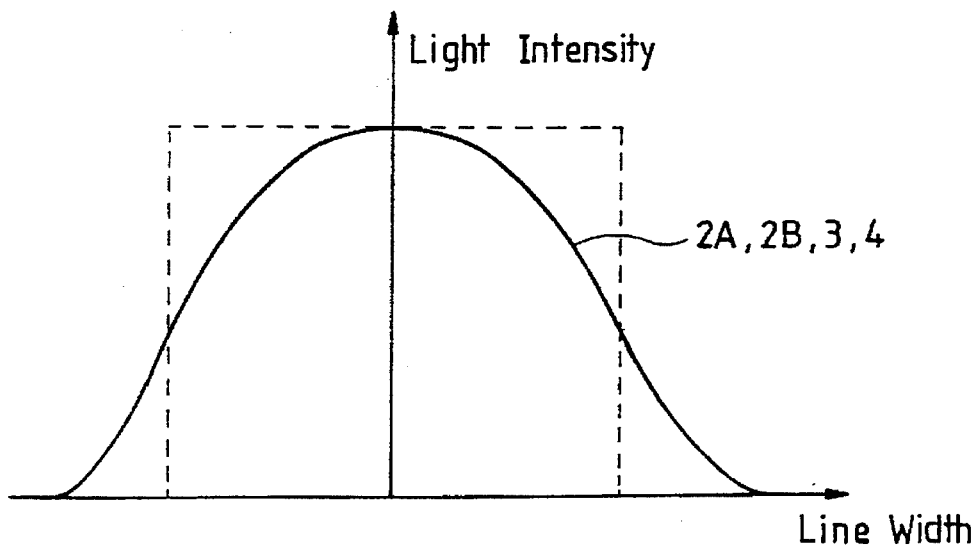
FIG. 4 is a graph illustrating light intensities respectively exhibited at different portions of the light exposure mask shown in FIGS. 3A to 3C.

On the other hand, FIGS. 3B and 3C are plan views respectively showing portions of the light exposure mask corresponding to peripheral circuit regions of the semiconductor device. These mask portions are provided with non-uniform patterns 3 or an independent pattern 4 including inner wirings. The line width X2 of each non-uniform pattern 3 is equal to the minimum line width X of the repeated patterns 2. The non-uniform patterns 3 have a space width Y2 larger than the minimum space width Y of the repeated patterns 2. On the other hand, the independent pattern 4 has a line width X3 larger than the minimum line width X of the repeated patterns 2. Since the light exposure mask has such line/space pattern dimensions, all the repeated patterns disposed at the central and peripheral portions 2A and 2B of the mask, non-uniform patterns 3 and independent pattern 4 exhibit the same contrast, as shown in FIG. 4.

The degree of increasing the line/space pattern widths can be determined through a light contrast simulation. It could be experimentally found that in the case of a ⅕-scale light exposure mask, a constant light contrast is obtained throughout the exposure mask when the width variation of the normal line/space pattern width of 0.2 to 0.7 µm ranges from 0.02 to 0.2 µm.

As apparent from the above description, the present invention provides a light exposure mask for a semiconductor device having different line/space pattern widths at different mask portions in such a manner that its repeated patterns disposed at the central mask portion corresponding to the memory region of the semiconductor device have a minimum line/space width whereas those disposed at the peripheral mask portion have a line/space width larger than the minimum width, such that its non-uniform patterns disposed at the peripheral mask portion have a space width larger than the minimum width, and such that its independent pattern has a line width larger than the minimum width. With such line/space pattern widths, the light exposure mask is capable of preventing a short circuit caused by the residue of a photoresist film material after a light exposure according to the modified illumination method or a disconnection caused by an excessive light exposure, forming a precise micro pattern, increasing the process redundancy, and thereby achieving an improvement in process yield and operation reliance.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A light exposure mask for a semiconductor device, including a transparent substrate, repeated patterns, non-uniform patterns and an independent pattern, each of the repeated patterns being formed on a portion of the transparent substrate corresponding to a memory region of the semiconductor device, and each of the non-uniform and independent patterns being formed on a portion of the transparent substrate corresponding to a peripheral circuit region of the semiconductor device, wherein:

the repeated patterns have a minimum line/space pattern width at a central portion of the mask and a line/space pattern width larger than the minimum line/space width at a peripheral portion of the mask;

the non-uniform patterns have a space width larger than the minimum space width; and the independent pattern has a line width larger than the minimum line width.

2. The light exposure mask in accordance with claim 1, wherein the repeated patterns have a line/space pattern width variation ranging from 0.02 to 0.2 µm when those disposed at the central mask portion have a line/space pattern width ranging from 0.2 to 0.7 µm.

* * * * *